(12) United States Patent
Furtner

(10) Patent No.: US 7,339,502 B2
(45) Date of Patent: Mar. 4, 2008

(54) METHOD AND DEVICE FOR TRANSMITTING DATA OVER A PLURALITY OF TRANSMISSION LINES

(75) Inventor: Wolfgang Furtner, Fuerstenfeldbruck (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/577,086

(22) PCT Filed: Oct. 21, 2004

(86) PCT No.: PCT/IB2004/052162

§ 371 (c)(1),
(2), (4) Date: Nov. 15, 2006

(87) PCT Pub. No.: WO2005/041164

PCT Pub. Date: May 6, 2005

(65) Prior Publication Data

US 2007/0164883 A1    Jul. 19, 2007

(30) Foreign Application Priority Data

Oct. 22, 2003 (EP) .................................. 03103906

(51) Int. Cl.
*H03M 5/00* (2006.01)

(52) U.S. Cl. .................... 341/55; 341/56; 375/264; 375/286; 375/288; 375/292

(58) Field of Classification Search ............. 341/55–56
See application file for complete search history.

(56) References Cited

U.S. PATENT DOCUMENTS

| | | | | |
|---|---|---|---|---|
| 5,259,002 A | | 11/1993 | Carlstedt et al. | |
| 5,740,201 A | * | 4/1998 | Hui | 375/286 |
| 6,137,455 A | * | 10/2000 | Duo | 345/520 |
| 6,154,498 A | * | 11/2000 | Dabral et al. | 375/257 |
| 6,278,740 B1 | * | 8/2001 | Nordyke | 375/257 |
| 6,538,584 B2 | * | 3/2003 | Borkar et al. | 341/58 |
| 6,556,628 B1 | * | 4/2003 | Poulton et al. | 375/257 |
| 6,898,201 B1 | * | 5/2005 | James et al. | 370/400 |
| 6,917,312 B2 | * | 7/2005 | Bessios | 341/56 |
| 7,061,408 B2 | * | 6/2006 | Poechmueller | 341/55 |
| 7,113,550 B2 | * | 9/2006 | Stonecypher et al. | 375/288 |
| 7,142,612 B2 | * | 11/2006 | Horowitz et al. | 375/286 |
| 7,184,483 B2 | * | 2/2007 | Rajan | 375/244 |

FOREIGN PATENT DOCUMENTS

WO    WO 99/32984    7/1999

* cited by examiner

*Primary Examiner*—Khai M. Nguyen

(57) ABSTRACT

In the case of a method and a device for transmitting data units by way of a transmission medium that comprises at least three adjacent transmission lines, first of all a plurality of codes is supplied. Each code has a number of code sections that corresponds to the number of transmission lines of the transmission medium. Each code section has on an associated transmission line a predetermined signal value, the sum of the signal values for each transmitted code being substantially constant. For each data unit to be transmitted, a code is selected from the plurality of codes, and the selected code is supplied for transmission by way of the transmission medium. The data units and the codes to be transmitted can be supplied in accordance with a predetermined clock pulse, a new code being selected at each new clock pulse, based on the preceding code and the new data unit.

12 Claims, 17 Drawing Sheets

| Wires | Codes | | | | | | |
|---|---|---|---|---|---|---|---|
| | total | 0-Hot | 1-HOT | 2-Hot | 3-Hot | 4-Hot | 5-Hot |
| 3 | 8 | 1 | 3 | 3 | 1 | - | - |
| 4 | 16 | 1 | 4 | 6 | 4 | 1 | - |
| 5 | 32 | 1 | 5 | 10 | 10 | 5 | 1 |
| 6 | .... | .... | .... | .... | .... | .... | .... |
FIG. 6
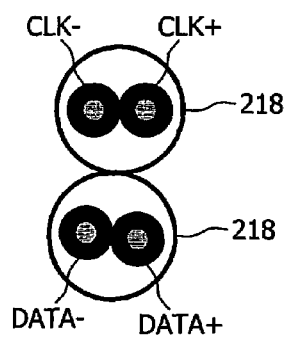
FIG. 7A
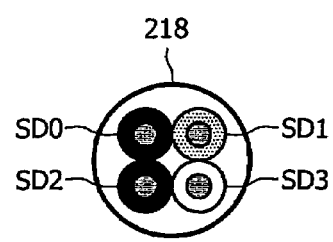
FIG. 7B

METHOD AND DEVICE FOR TRANSMITTING DATA OVER A PLURALITY OF TRANSMISSION LINES

The present application claims the benefit of priority of PCT International Application No. PCT/IB04/52162, filed on Oct. 21, 2004, and European Patent Application No. 03103906.8, filed on Oct. 22, 2003.

The present invention relates to a method and to a device for transmitting data units by way of a transmission medium and to a method and to a device for receiving data units by way of a transmission medium and in particular to methods and to devices for transmitting large amounts of data between different electronic elements and here in particular to the transfer of data between a graphics control and a liquid crystal display.

In modern electronics applications, large amounts of data have to be transferred between components, between printed circuit boards (PCB) and also between integrated circuits that have a common housing. The aim of such a transfer of large data amounts consists in maximizing the data transfer rate, simultaneously reducing electromagnetic interference (EMI) and again simultaneously reducing the interface costs. The transmission speed, the electromagnetic interference or electromagnetic compatibility and the system costs are the main aspects in such applications.

FIG. 1 shows a block diagram showing the EMI influences during the transfer of data between a transmitter 100 and a receiver 102. The transmitter 100 is, for example, a display control, and the receiver 102 is the associated display. Data, for example, binary data, is transmitted from the transmitter 100 to the receiver 102 by way of a transmission medium 104, as indicated by the arrow in FIG. 1. The transmission medium 104 is a transmission medium having a plurality of transmission lines arranged adjacent one another, wherein upon a transmission of large amounts of data combined with simultaneous transitions (change of signal level, e.g. H→L or L→H) of the binary signals an emission is generated, which may lead to electromagnetic interactions in adjacent electronic elements. Similarly, electromagnetic energy can be coupled into the transmission lines of the transmission medium 104 and cause disruption in the receiver.

Nowadays, the amount of data to be transmitted is increasing rapidly and higher data rates are continually being demanded. Especially in the case of data for moving images having a high resolution it is necessary to manage high data rates in real time, and compression techniques cannot be used in all cases. The losses caused thereby are often not acceptable or corresponding decompression costs cannot be financed on the receiver side.

With an increasing signal bandwidth, extra precautions have to be taken with regard to electromagnetic interference (EMI). The transmission must be immune to electromagnetic rays from the environment, and the emission inherent to the transmission must moreover be minimized in order to avoid interference with other system components. In the case of electronic appliances for the end user, very strict standards are applied in order to ensure electromagnetic compatibility between the different appliances, although the costs involved in meeting these standards are to be reasonable. Take as an example matrix display devices, such as, for example, liquid crystal displays (LCD), in which an increasing screen resolution requires ever-higher bandwidths in respect of the data to be transmitted, wherein the EMI requirements have become increasingly strict in recent years. A high-speed interface is required not only between the graphics control in the computer and the display control in the visual display unit, but also between the display controller and the individual column drivers of the display.

FIG. 2 shows an example of a matrix display having a display control 106 and an external graphics control 108. The personal computer in which the graphics control 108, for example in the form of a graphics card, is arranged, is located in the region to the left of the broken line and is shown diagrammatically. The display device, the screen, which includes the display control, is located to the right of the broken line. By way of a first connection 110 the graphics control 108 transmits the required image data from the personal computer (PC) to the display control, and also a screen refresh command, to refresh the screen. By way of a plurality of transmission lines $112_1$-$112_n$, the display control 106 applies the corresponding drive signals to a plurality of column drivers $114_1$-$114_n$. The column drivers drive the individual columns $116_1$-$116_n$ of the matrix display 118. The matrix display 118 is, for example, a WUXGA (WUXGA=Wide-Ultra Extended Graphics Array) having a resolution of 1.920×1.280 RGB-pixels (R=red, G=green, B=blue). In the case of the example illustrated in FIG. 2, a screen refresh of the WUXGA matrix display element (1.920×1.280 pixels) requires about 7 Mbytes, which are to be transmitted. This update conventionally takes place at a frequency of 60 Hz, which corresponds to a net data rate of about 422 MBytes/second. It should be pointed out that this still does not include the blank phases that have to be inserted for proper operation. A WUXGA-LCD with eight display column drivers will therefore require about 500 Mbit/second (peak data rate), which are to be transmitted to each of the drivers $114_1$-$114_n$.

In order to satisfy the high-speed requirements whilst simultaneously maintaining the electromagnetic compatibility, different signal transmission or signaling techniques are known in the art. One example of these known techniques is the so-called differential signaling technique. FIG. 3 shows a known circuit for differential signaling and the waveform of the signals used therein.

FIG. 3A shows the circuit for differential signaling, which comprises a transmitter 10 and a receiver 102. The transmitter 100 and the receiver 102 are connected with one another by way of a transmission medium 104 comprising four transmission lines $104_1$-$104_n$. The transmitter 100 comprises a first input DATA for receiving by way of one or more data lines the data to be transmitted, and a second input CLK for receiving the clock signal to be transmitted. In the receiver 100 there are arranged a data driver 120 and a clock driver 122, which receive the data signal from the input DATA and the clock signal from the input CLK respectively. On a first intra-transmitter line 120a, the data driver 120 supplies the data signal to be transmitted to a data output 124a of the transmitter 100. On a second intra-transmitter line 120b, the data driver 120 supplies the inverted form of the appearing data signal to an inverted output 124b of the transmitter 100. Similarly, on a first intra-transmitter clock line 122a the clock driver 122 supplies the appearing clock signal to the clock output 126a of the transmitter 100. On a second intra-transmitter clock line 122b the clock driver 122 supplies an inverted form of the clock signal to the inverted clock output 126b of the transmitter 100.

The receiver 102 comprises a data differential amplifier 128 and a clock differential amplifier 130. At an output DATA' of the receiver 102, the data differential amplifier 128 outputs the data signal received by way of the transmission medium 104. Similarly, at an output CLK' of the receiver 102 the clock differential amplifier 130 outputs the clock signal received by way of the transmission medium 104. A respective terminating resistor R is connected between the inverted and non-inverted inputs of the differential amplifiers 128 and 130. The differential amplifier 128 receives the difference of the signals DATA+ and DATA− transmitted by way of the transmission medium. Interference during the transmission has an identical effect on DATA+ and DATA− and does not affect the receiver owing to the differential amplifier. By way of a data input 132*a*, the data differential amplifier 128 receives at its non-inverted input the non-inverted data signal DATA+. By way of an inverted data input 132*b* of the receiver 102, the inverted input of the data differential amplifier 128 receives the inverted data signal DATA− from the transmission medium 104. Similarly, the non-inverted input of the clock differential amplifier 130 receives by way of a clock input 134*a* of the receiver 102 the non-inverted clock signal CLK+ from the transmission medium 104. The inverted input of the clock differential amplifier 130 receives the inverted clock signal CLK− by way of an inverted clock signal input 134*b* of the receiver 102.

As can be seen from FIG. 3A, the transmission line 104$_1$ carries the inverted data signal DATA−, the transmission line 104$_2$ carries the non-inverted data signal DATA+, the transmission line 104$_3$ carries the inverted clock signal CLK− and the transmission line 104$_4$ carries the non-inverted clock signal CLK+.

As is indicated by the information $I_{DATA+(t)}$ and $I_{DATA-(t)}$ in FIG. 3A, on the transmission of data between the transmitter 100 and the receiver 102, no voltage levels are used, but rather current levels. By virtue of the transmission of the data signals and the inverted data signals, the sum of the currents on the corresponding data lines 104$_1$ and 104$_2$ and on the corresponding clock lines 104$_3$ and 104$_4$ amounts to zero.

FIG. 3B indicates the signal waveforms of the signals DATA and CLK applied to the receiver 100, and also the signals CLK+, CLK−, DATA+ and DATA− transmitted by way of the transmission medium 104.

According to the conventional approach of differential signaling technology, parallel to the data signal an inverted version of the same is transmitted. When two transmission lines or wires extend in close proximity to one another the data transmissions will be complementary and the emissions caused thereby will compensate for each other. An electromagnetic radiation or EMI that is induced in the parallel transmission lines has the same influence on both lines. By determining the difference by means of the differential amplifiers 128, 130, instead of the absolute level on the individual lines a large noise immunity is achieved. Conventionally, as already mentioned, the data is transmitted by means of current levels instead of voltage levels. The terminating resistor R, which adapts the line impedance to the input impedance of the receiver 102, connects a respective pair of lines, the lines 104$_1$ and 104$_2$, and the lines 104$_3$ and 104$_4$, on the receiver side 102. This eliminates reflections and enables a higher transmission rate on the basis of incident wave switching. The data clock pulse, as mentioned, is transmitted with an additional differential line pair 104$_3$ and 104. By transmission of data the clock frequency is halved at both the negative and at the positive clock pulse edge. This technique, as has just been described with reference to FIG. 3, is used, for example, at the well-known RSDS interface (RSDS—Reduced Swing Differential Signaling).

The frequency of the transmitted clock signal can moreover be reduced by transmitting only a divided version or a fraction of the data clock pulse, for example, a tenth of the same. This requires a phase retrieval PLL (PLL=Phase-Locked Loop) on the receiver side, however. This technique is used, for example, at the LVDS interface (LVDS=Low Voltage Differential Signaling).

Another method known in the art is the so-called "data/strobe encoding", an example of a circuit and the data signals present in this circuit being illustrated with FIG. 4.

As can be seen from FIG. 4A, the data transmission section shown there corresponds to the section described with reference to FIG. 3A. Unlike FIG. 3A, in the data/strobe approach described in FIG. 4A the clock input CLK of the receiver 100 is not directly connected with the input of the clock driver 122. The input of the clock driver. 122 is connected with an output of an XOR-gate 138, which as its input signals receives the clock signal from the input CLK and the data signal from the input DATA. Unlike the exemplary. embodiment shown in FIG. 3A, here it is not the clock signal itself but the strobe signal in its non-inverted form STRB+ and in its inverted form STRB− that is transmitted by means of the. clock driver 122 over the transmission lines 104$_4$ and 104$_3$ respectively to the receiver 102. Unlike the exemplary embodiment shown in FIG. 3A, here the output of the clock or strobe. differential amplifier 130 is connected on the receiver side with a first input of an XOR-gate 140, which at a second input receives the output signal of the data differential amplifier 128 and has an output that is connected with the clock signal output CLK' of the receiver 102.

The signals running in the circuit in FIG. 4A are illustrated in FIG. 4B.

By means of the procedure in accordance with the "data/strobe encoding" described with reference to FIG. 4, the number of signal changes (transitions) in such a transmission scheme is reduced. The basic concept consists in transmitting a strobe signal, which changes when the data signal does not change. Thus either the data signal or the strobe signal changes with each transmitted bit, but at least one of the same, as is clear from FIG. 4B. The clock pulse can be recovered by using an XOR-function between the strobe signal and the data signal. The well-known firewire standard (IEEE 1394) uses this approach. According to the data/strobe encoding, as it is used, for example, in the firewire application of Apple Computers Inc., the data is combined with a clock pulse having two edges (corresponding to half the bit clock pulse) by way of a XOR-logic operation in order to produce a strobe signal. In each cycle, either the data signal or the strobe signal changes, never both. By an XOR combining of data signal and strobe signal, the clock pulse can be recovered straightaway without the need for a phase-locked loop.

Additionally, approaches that use a serial bit transfer often insert known bit transitions in the data stream, in order thus to permit a timing recovery. Temporary bit sequences are re-coded into longer bit sequences with guaranteed or fixed transitions. In this process, no explicit clock pulse transmission is necessary, since by means of a phase-locked loop at the receiver side the clock pulse based on the data can be recovered or reconstructed. This approach is customary in the case of network applications.

The disadvantage of the conventional transmission techniques just described is that although these have good EMI properties, they are associated with high interface or circuit costs and have a limited data transmission rate.

Starting from this state of the art, it is an object of the present invention to produce an improved system for exchange of data by way of a transmission medium having a plurality of adjacent transmission lines, which system, whilst retaining a good EMI property, enables the interface and circuit costs to be appreciably reduced and at the same time the data rate to be increased.

The present invention produces a method for sending data units by way of a transmission medium that includes at least three adjacent transmission lines. An embodiment of the method includes the following steps:

(a) supplying a plurality of codes, each code comprising a number of code sections that corresponds to the number of transmission lines of the transmission medium, each code section of a code on an associated transmission line having a predetermined signal value, and the sum of the signal values being substantially constant for each transmitted code;
(b) for each data unit to be transmitted, selection of a code from the plurality of codes; and
(c) supplying the selected code for a transmission by way of the transmission medium.

The data units and the codes to be transmitted are preferably supplied in accordance with a predetermined clock pulse, wherein in step (b) at each new clock pulse a new code is selected, based on the preceding code and the new data unit. The code is preferably a binary code, each of the codes comprising the same number of code sections with a high logic level and code sections with a low logic level. The data unit comprises preferably one bit or a plurality of bits, and furthermore the sum of the signal values can be selected so that this is substantially zero.

The present invention furthermore produces a device for transmitting data units by way of a transmission medium that comprises at least three adjacent transmission lines, having an input for receiving the data units; a memory, in which a plurality of codes is stored, each code comprising a number of code sections that corresponds to the number of transmission lines of the transmission medium, each code section of a code on an associated transmission line having a predetermined signal value, and the sum of the signal values being substantially constant for each transmitted code; a selection device, which is actively connected with the input and the memory in order to select and supply from the memory a code for a data unit received at the input; and an output that is actively connected with the selection device in order to supply the code supplied by the same for a transmission by way of the transmission medium.

The device according to the invention preferably comprises a clock input for receiving a clock-pulse, a data unit appearing at the input at each new clock pulse, and the selection device selecting and supplying, on the basis of the preceding code and a new data unit, a new code for the new clock pulse.

According to a further aspect of the present invention, the invention produces a method for receiving data units from a transmission medium that comprises at least three adjacent transmission lines, the data units having been sent in accordance with the above-described method for sending the same. The transmitted codes are received, assigned to the appropriate data units and the data units thus created are output. The method furthermore preferably comprises the recovery of a clock signal based on the transitions of the codes transmitted by way of the transmission medium.

According to a further aspect of the present invention, a device for receiving data units from a transmission medium that comprises at least three adjacent transmission lines is produced, the data units being sent by the device described above. The device comprises an input for receiving the codes from the transmission medium, an arrangement for assigning the received codes to the corresponding data units and an output for supplying the same. A timing recovery circuit for recovering a clock signal based on transitions of the codes transmitted by way of the transmission medium can preferably be provided.

According to a further aspect, the present invention produces a method for transmitting data units by way of a transmission medium having at least three adjacent transmission lines, the data units being sent and received in accordance with the above-described methods.

According to a further aspect, the present invention produces a device for transmitting data units that comprises the above-described devices for sending and for receiving the data units, which devices are connected with one another by means of a transmission medium having at least three adjacent transmission lines.

The present invention is based on the realization that by means of so-called multi-wire signaling (MWS), EMI properties can be achieved similar to those that can be obtained with a pair of parallel lines that are driven in a differential manner, the MWS approach requiring three or more lines arranged substantially adjacent. The inventors have established that as long as the sum of the currents in all parallel lines is constant over time, the emissions of the individual lines compensate for one another. The sum of the dynamic currents can preferably be zero in order to avoid a static current via the ground connection.

The inventive approach of using the MWS technique preferably produces a method for transmitting binary data by way of a plurality of lines or wires at a high data rate and with low electromagnetic interference (EMI). In accordance with the invention, a special encoding technique is used in-order to reduce signal changes on the transmission lines and to co-ordinate the data changes, in order thereby to reduce the electromagnetic emissions. By means of the encoding technique according to the invention, timing information can preferably be incorporated into the transmitted signal such that the clock pulse can be recovered at the-receiver side without the use of a phase-locked loop (PLL). This allows the use of a simple transmitter-and-receiver circuit as well as an efficient use of the transmission channel bandwidth, which collectively leads to cost-effective interface solutions.

Compared with conventional or traditional binary differential interface techniques, with or without data/strobe encoding, the MWS approach according to the invention offers considerable advantages. While retaining a good EMI-property, at the same time the interface and circuit costs are reduced and the data rate can be increased.

Using a three-wire system, the same amount of data per transmission cycle can be transmitted as with a conventional differential data/clock pulse or data/strobe pair. One wire and one shielding can be dispensed with, however, if the application is cable-based. The transition rate and the maximum signal frequency are identical with the data/strobe-encoded system.

In a four-wire system, the same number of lines or wires is used as in the case of the differential signaling approach according to FIGS. 3 and 4, but double the amount of data (2 bits/second) can be transmitted per cycle. Moreover, the mean transition rate per bit is reduced to below that of the data/strobe encoded system. In the case of cable-based applications, all four lines can use a common shield.

Compared with conventional or traditional approaches, the MWS approach according to the invention is more suitable for high speed and low EMI interface applications by virtue of the lower costs. The easily recoverable timing and the availability of additional control signals (ESC=escape sequences) in systems with four or more lines or wires leads to further advantages in many applications.

These and other aspects of the invention are apparent from and will be elucidated, by way of non-limitative example, with reference to the embodiments described hereinafter.

In the drawings:

FIG. 6 is a table that specifies how many binary codes having a specific number of "1"s (0=hot, . . . , 5-hot) there are for different numbers of transmission lines;

FIG. 7A shows the wiring topology according to conventional differential signaling;

FIG. 7B shows the wiring topology according to the inventive multi-wire signaling;

With reference to. FIGS. 5 to 17, preferred exemplary embodiments of the present invention will be explained in detail below, elements shown in the Figures having identical or similar action being provided with the same reference numerals.

Figure 1:
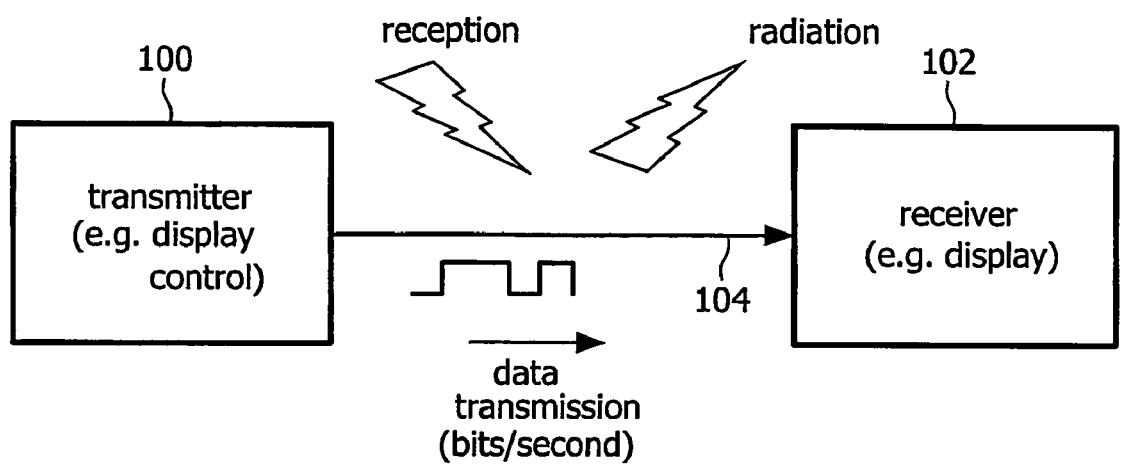
FIG. 1 is a block diagram showing the EMI influences during the transmission of data between a transmitter and a receiver.
Figure 2:
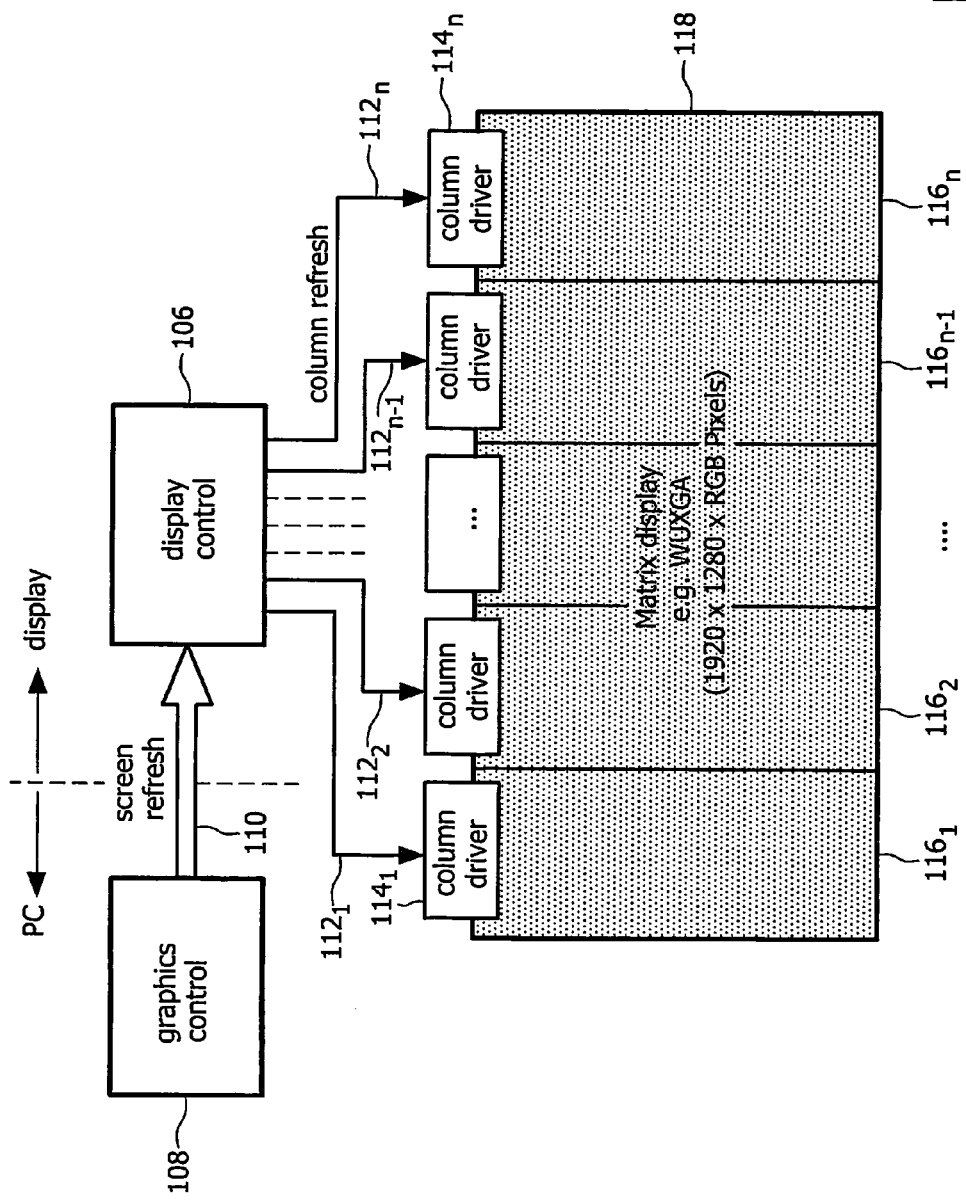
FIG. 2 is a block diagram of a matrix display with display control and external graphics-control.
Figure 3A:
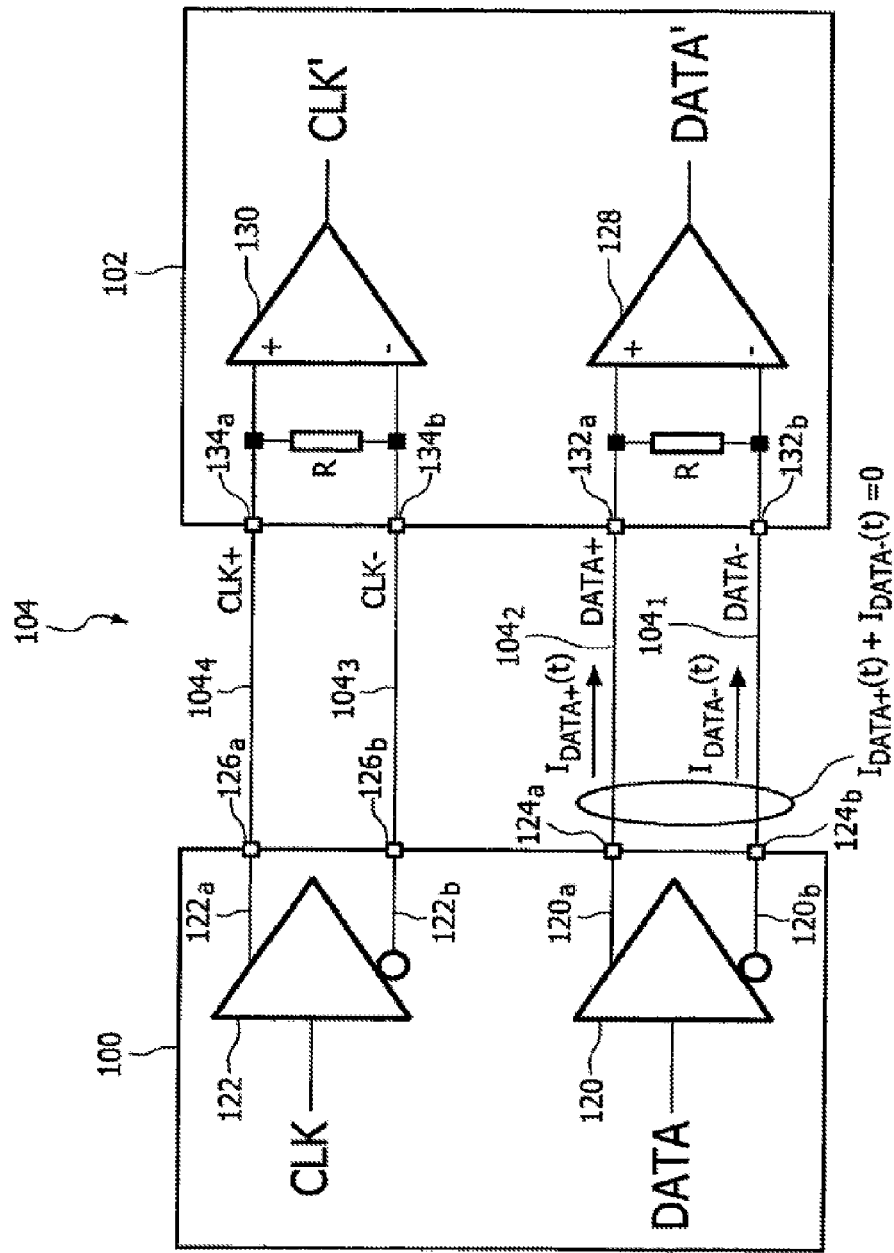
FIG. 3A shows a known circuit for differential signaling of data and clock pulse signals.
Figure 3B:
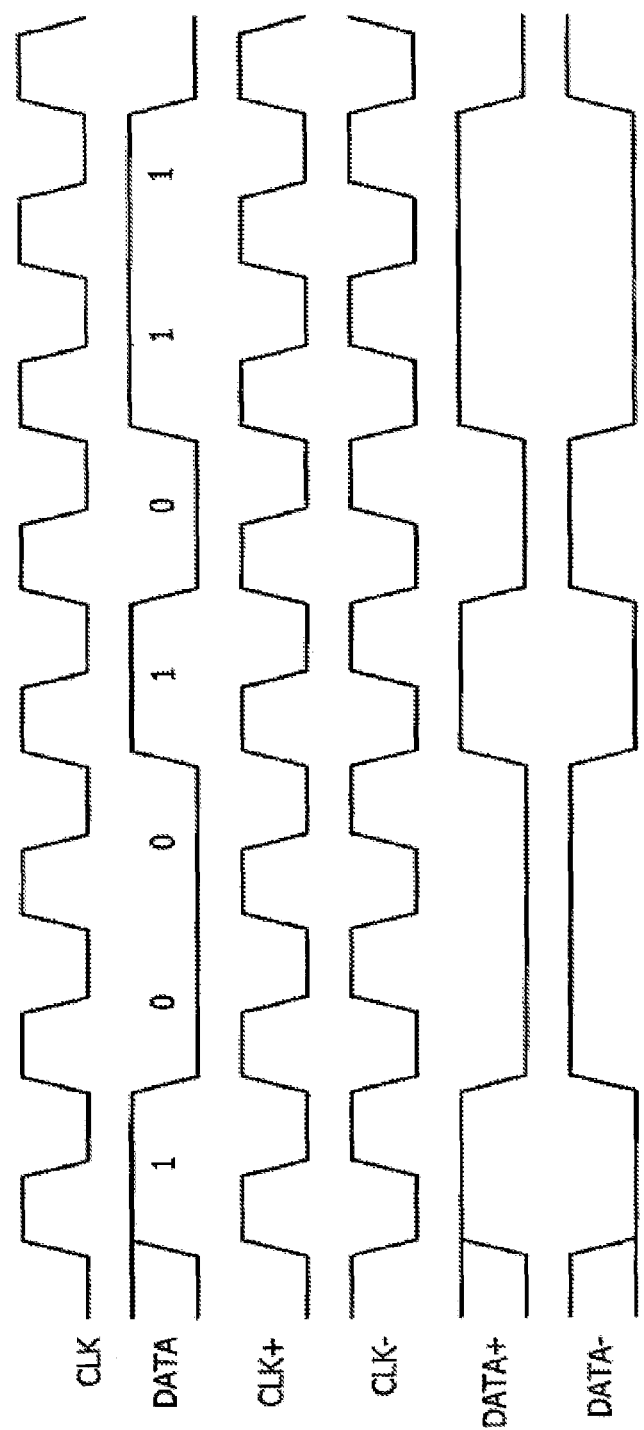
FIG. 3B shows the waveform of the signals used in the circuit in FIG. 3A.
Figure 4A:
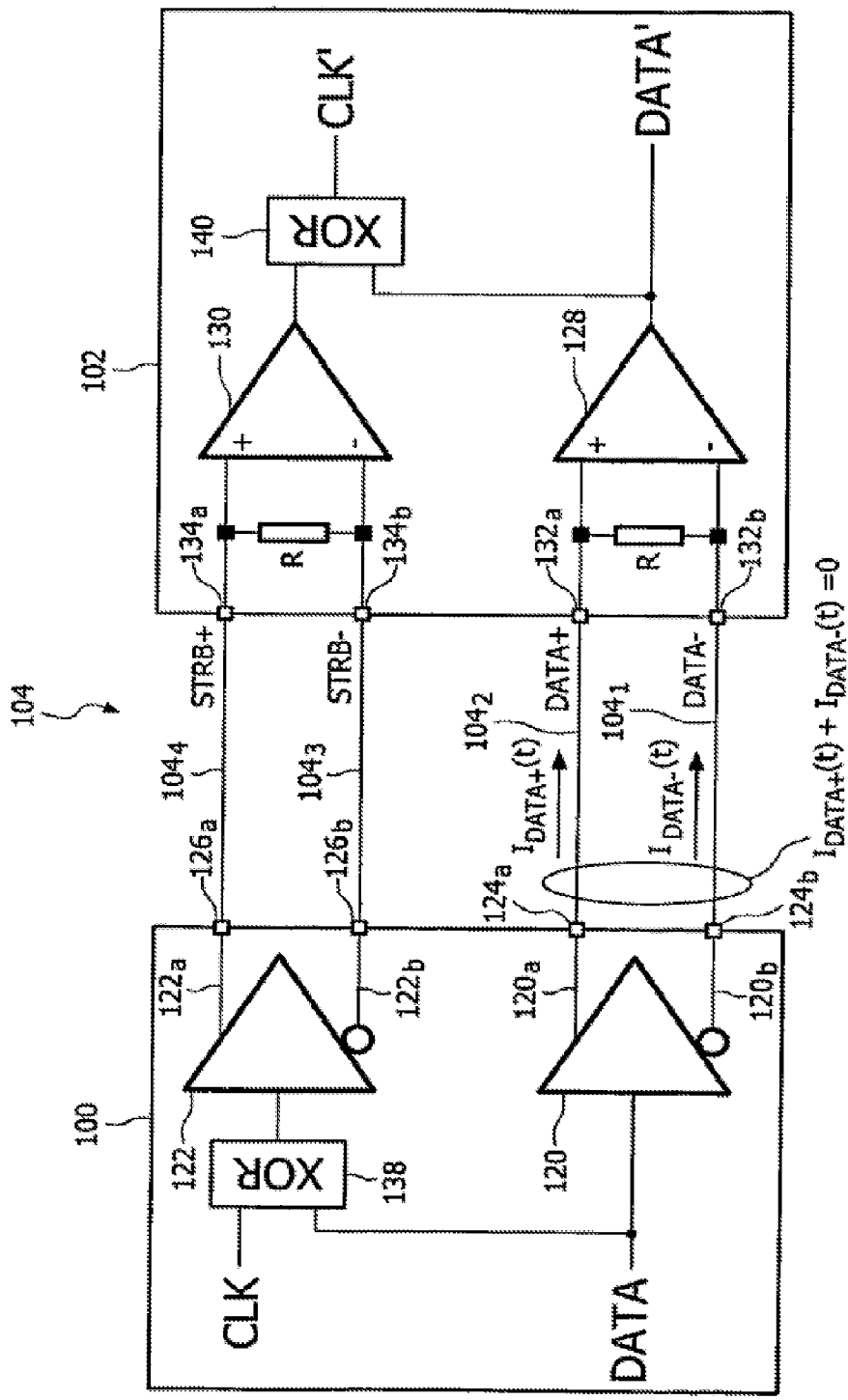
FIG. 4A shows a known circuit for a data/strobe encoding.
Figure 4B:
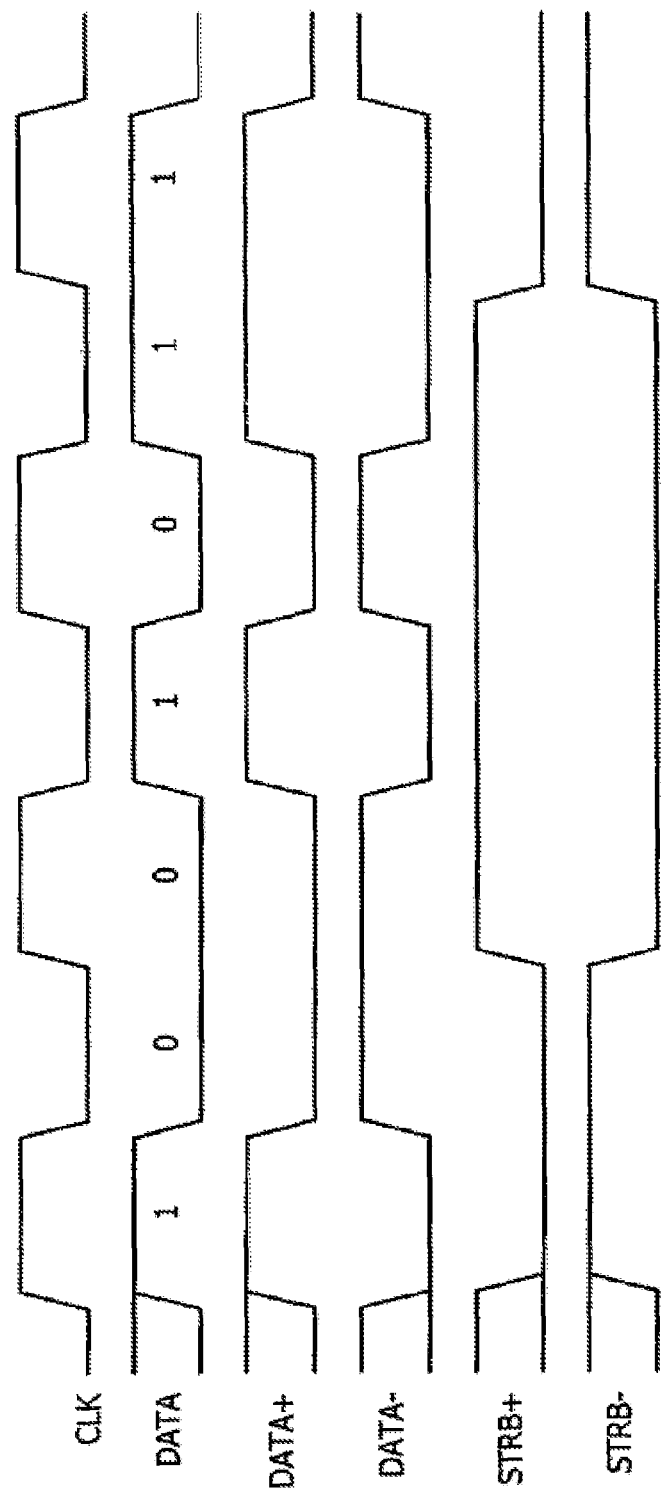
FIG. 4B shows the waveform of the signals used in the circuit in FIG. 4A.
Figure 5:
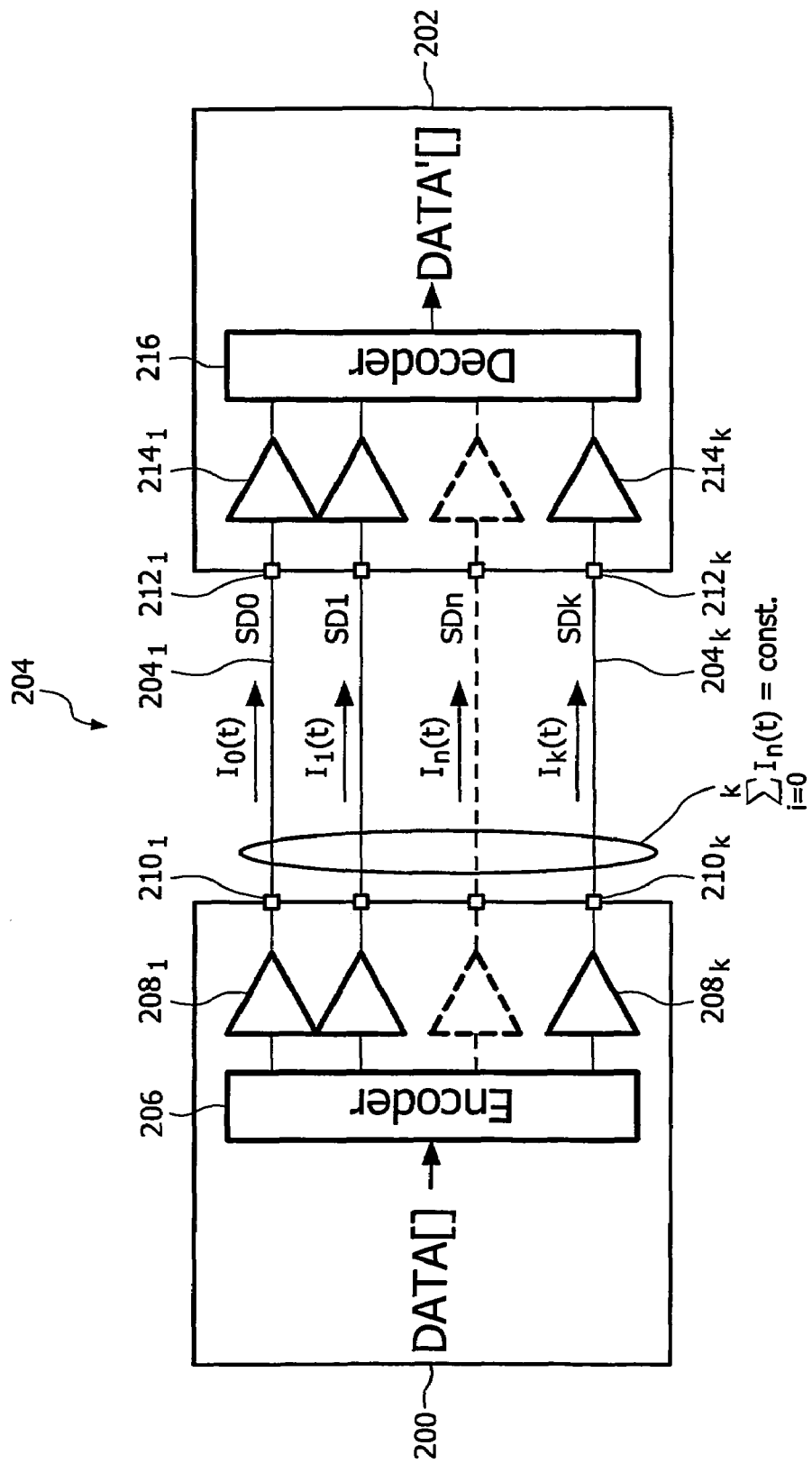
FIG. 5 is a schematic representation of a first exemplary embodiment of the system according to the invention for transmission of data in accordance with multi-wire signaling (MWS)

FIG. 5 shows a schematic representation of a first exemplary embodiment of the inventive system for transmission of data in accordance with a multi-wire signaling. The system comprises a transmitter 200 and a receiver 202, which are connected with one another by way of a transmission medium 204. The transmission medium 204 comprises a plurality of transmission lines $204_1$-$204_k$.

At an input DATA the transmitter 200 receives the data signal, which is entered in an encoder 206. On the basis of the data signal at the input DATA, the encoder 206 generates a code signal SD, which comprises a plurality of code sections SD0-SDk, the number of code sections corresponding to the number of transmission lines $204_1$-$204_k$. By way of corresponding drivers $208_1$-$208_k$, the code sections or their signal values supplied by the encoder 206 are supplied to the outputs $210_1$-$210_k$ of the transmitter 200. The outputs $210_1$-$210_k$ of the transmitter 200 are connected with the corresponding transmission lines $204_1$-$204_k$. The receiver 202 comprises a plurality of inputs $212_1$-$212_k$, corresponding to the number of transmission lines, the inputs $212_1$-$212_k$ being connected with the corresponding lines $204_1$-$204_k$ of the transmission medium. The signal values of the individual code sections SD0 to SDk received at the inputs $212_1$-$212_k$ are supplied to corresponding drivers $214_1$-$214_k$, which in turn supply the received signals to a decoder 216, which, on the basis of the received signal values or code signals, generates the data output signal applied to the output DATA' of the receiver circuit 202.

As mentioned above, the MWS approach according to the invention recognizes that EMI properties similar to those achieved with the pair of parallel driven lines in the differential approach are also achievable with three or more lines, as long as the sum of the currents in all parallel lines is constant over time. In this case, the emissions of the individual lines compensate for one another. The sum of the dynamic currents can be zero, in order to avoid a static current via the ground connection.

According to the invention, it was recognized that the differential principle can be extended to a plurality of wires that are arranged in close spatial relationship with one another. All codes that lead to a current sum constant over time can be transmitted by way of the individual lines $204_1$-$204_k$ of the transmission medium 204. This can be used independently of the transmitted data.

In the case of a binary transmission, a "0" and a "1" indicate different currents that flow on-the transmission line. A "1" can mean, for example, that a specific current is flowing from the receiver to the sender and a "0" can mean that a current of the same magnitude is flowing in the opposite direction. On the other hand, a "1" can also mean that a specific current is, flowing, and the "0" then means that the current is zero. When only codes that use a constant number of "1"s and "0"s (DC-balanced codes) are transmitted, the sum of the currents will likewise become constant. In transition phases, the current then rising on one line is compensated for by a correspondingly dropping current in another line. For a given number of code bits that are transmitted in parallel, there is a number of codes having only one binary "1", having two binary "1"s etc. These different multi-wire codes are shown in the table in FIG. 6, which for a wire number of 3, 4 and 5 shows the respective total number of possible codes as 8, 16 and 32, the columns 0-hot to 5-hot each indicating how many codes with a corresponding number of "1"s exist. The column 0-hot gives, for example, the number of codes that contain no "1" at all, the column 1-hot gives for the different numbers of wires the number of codes that contain only one "1" etc. There are always as many codes with a fixed number of "1"s as there are codes with the identical fixed number of "0"s, since in this case respective inverted versions are involved. With an increasing number of wires used, more DC-averaged codes become available, as can be seen from the Table in FIG. 6. Four wires allow, for example, six codes with an equal number of "1"s and "0"s.

According to the invention the changeover between codes having the same number of "1"s and "0"s takes place in order to avoid dynamic supply currents. More wires allow more codes with a fixed number of "1"s and "0"s. There are always as many codes with a fixed number of "1"s as there are codes with an identical number of "0"s.

As is the case with differential transmission, the invention too provides for the wires to be guided in close spatial relationship. In a cable, immediately adjacent wires share a shield. On a printed circuit board, the conductive strips of the MWS system are arranged substantially parallel and adjacent one another. FIG. 7 shows the wiring topology according to a conventional approach and the inventive approach. As shown in FIG. 7A, here the data lines DATA+ and DATA− and the clock lines CLK+ and CLK− are surrounded by respective separate shields 218. Compared with this, the approach according to the invention, as shown in FIG. 7B, allows the arrangement of four transmission lines for the transmission of the respective code sections with a common shield 218, so that the multi-wire bundle shares the common shield. The arrangement according to the invention results in a low emission, since transitions from a high signal level to a low signal level and vice versa are compensated. The wires are arranged parallel and in close spatial proximity within a cable or on a printed circuit board.

Figure 8:
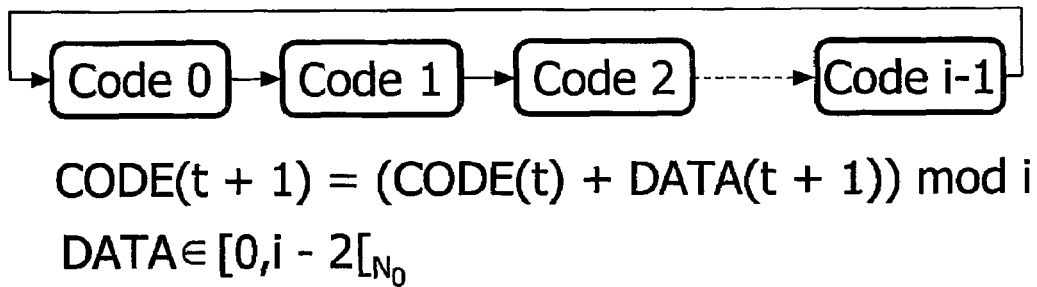
FIG. 8 is a block diagram illustrating the encoding of input data by code transitions.

According to a first approach according the invention, the available codes can be mapped directly onto the data. Per transmission cycle, $\log_2$ (number of DC-balanced codes) information bits could therefore be transmitted. According to a preferred exemplary embodiment, however, the mapping of data onto code transitions instead of onto the codes themselves is preferred, whereby an additional value is obtained. The next code transmitted is a function of the data and of the preceding code, as is clear from FIG. 8, which shows a block diagram that illustrates the encoding of input data by code transitions. The code is changed regardless of data changes and data values, which additionally results in continuous timing information on the receiver side. As can be seen from FIG. 8, with "i" codes, "i-1" code transitions can be recognized. As mentioned, code changes occur even without data changes, and every code change indicates a time event, the effect of which in turn is that the clock signals can be recovered in a simple manner from the encoded data without a phase-locked loop or other sophisticated recovery circuit engineering being required on the receiver side.

Some examples of the multi-wire code transition signaling according to the present invention are explained below.

Figure 9:
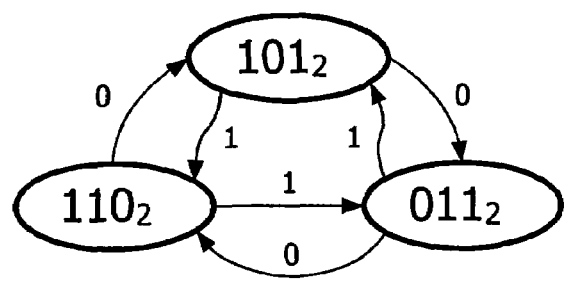
FIG. 9 is a state diagram for a three-wire code transition signaling according to one exemplary embodiment of the present invention.

FIG. 9 shows a state diagram for a three-wire code transition signaling according to one exemplary embodiment of the present invention. Taking the state $110_2$, for example, as starting point, if a data value "0" is present for transmission, then the code $101_2$ is transmitted. If, starting from the code $110_2$, a "1" is present for transmission, then the code $011_2$ is transmitted. Starting from the code $101_2$, in the presence of a "1" a switch is made to the code $110_2$, and in the presence of a "0" for transmission a switch is made to the code $011_2$. Starting from the code $011_2$, in the presence of a "1" a switch is made to the code $101_2$, and in the presence of a "0" as the data unit to be transmitted a switch to the code $110_2$ is made. In the exemplary embodiment illustrated in FIG. 9, there are three DC-balanced three-wire codes. For each code, transitions only to the two other codes are possible. The diagram shown in FIG. 9 shows which transitions are performed based on the data values. When DATA=0, the code, as can be seen, changes to the next code. When DATA=1, the code advances by two code values, which is synonymous with a continuation of the code in the reverse direction. Each code transition changes two bits. With two transitions, only one data bit can be encoded, but the required timing information is always contained.

As can be seen from FIG. 9, only the codes $110_2$, $101_2$ or $011_2$, or their inverted versions, are used here. Two transitions are possible here, one bit per clock pulse being transmitted. A "0" advances the code by 1 and a "1" advances the code by 2. Each transition changes two bits.

Figure 10:
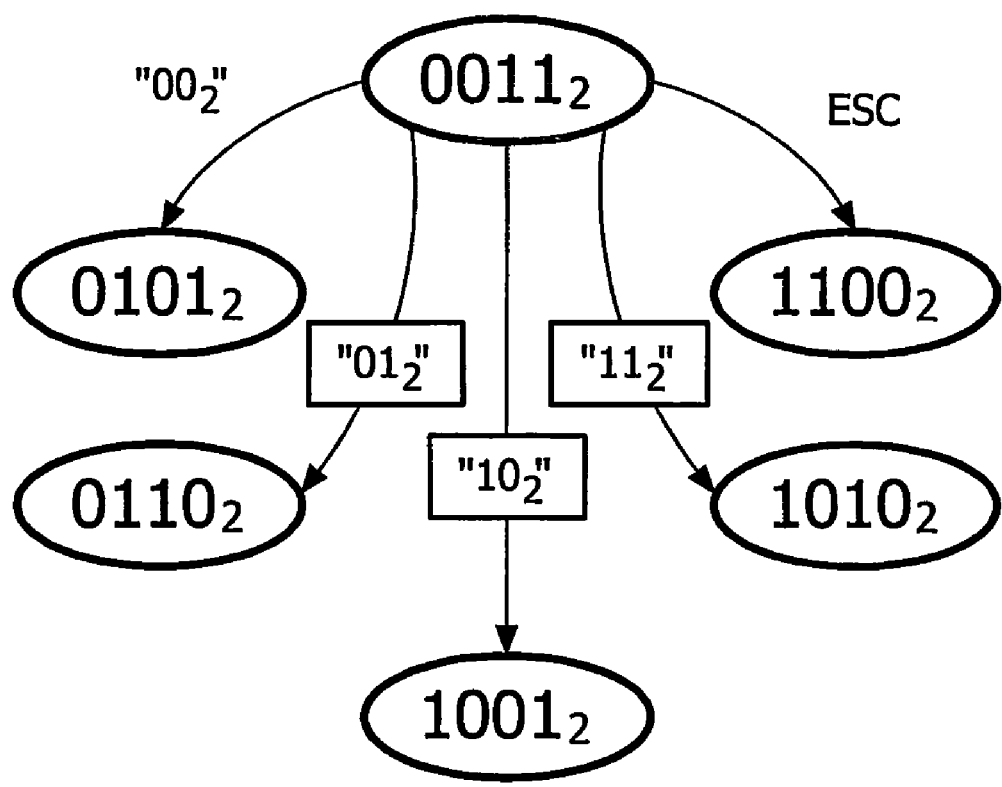
FIG. 10 is a state diagram for a four-wire code transition signaling according to a further exemplary embodiment of the present invention.

FIG. 10 shows a state diagram for a four-wire code transition signaling according to a further exemplary embodiment of the present invention. For the sake of simplicity, only the transition from the starting code $0011_2$ dependent on different data values, will be described with reference to FIG. 10. As can be seen, in the presence of a "$00_2$", the code $0011_2$ switches to the code $0101_2$. If a "$01_2$" is present as data value, the code switches to the code $0110_2$. If a data value "$10_2$" is present, the code switches to the code $1001_2$. If a data value "$11_2$" is present, the code switches to the code $1010_2$. An additional transition is available, in order, for example, on receipt of escape information (ESC-information), to switch to the code $1100_2$.

As can be seen in FIG. 10, with four wires there is a maximum of six DC-balanced codes, in that codes having an equal number of "0"s and "1"s are selected (see also the Table in FIG. 6). Five code transitions are possible in this case, as was explained with reference to FIG. 10. Two information bits can be assigned to the four transitions. The fifth transition can be used for control functions, for example, for marking the start or the end of a data block It can also be used to encode "0" data, in order to supply a clock signal when no data is to be transmitted. Four of the possible code transitions change two bits and one transition changes all four bits, so that on average 2.4 bits of the code are changed.

Figure 11:
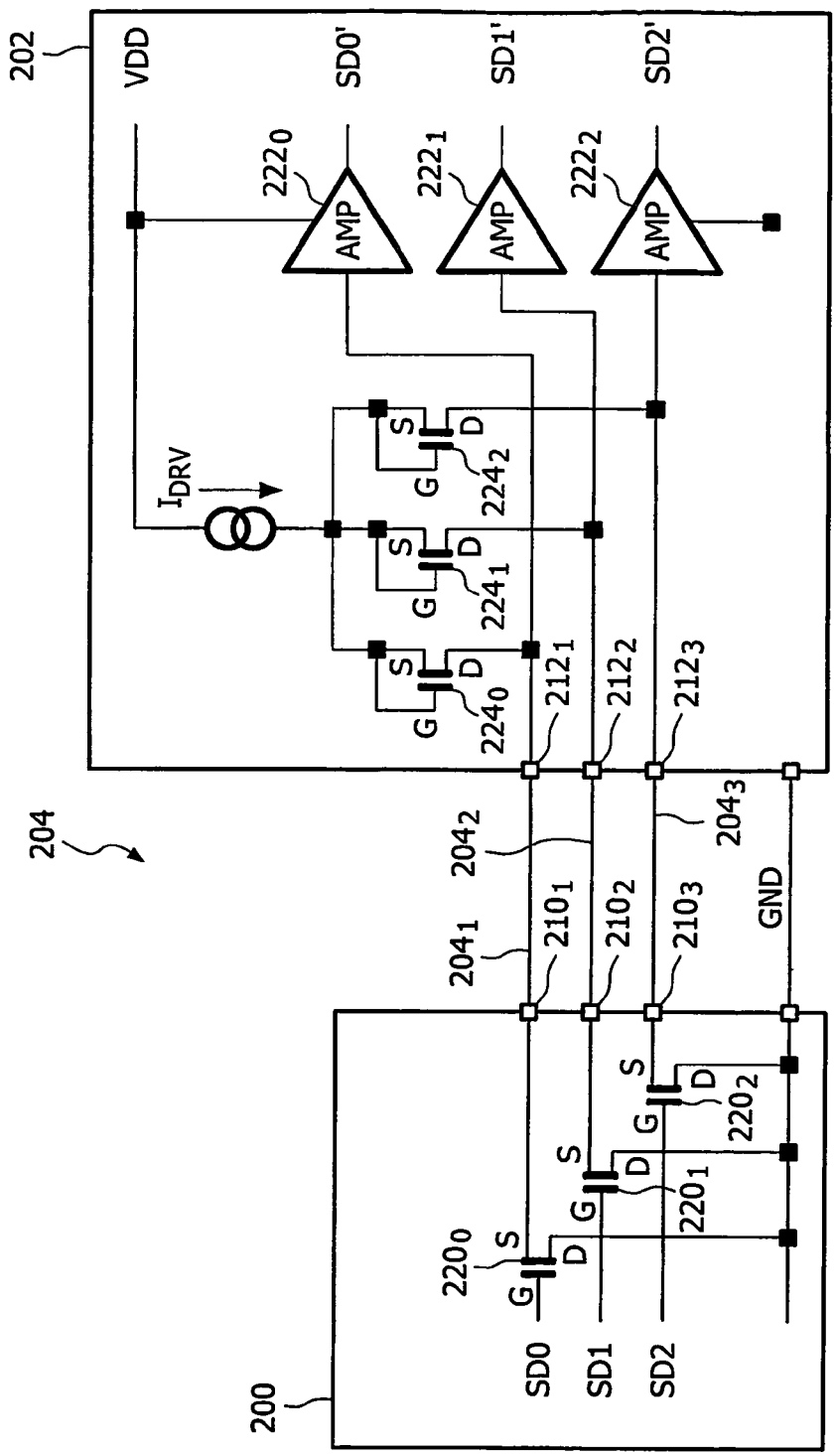
FIG. 11 shows an example of a three-wire interface according to one exemplary embodiment of the present invention.

FIG. 11 shows an example of a three-wire interface according to an exemplary embodiment of the present invention. The structure shown in FIG. 11 comprises an active termination, a simple driver structure, and a direct current via ground (GND).

As can be seen in FIG. 11, the transmitter 200 comprises three switches $220_0$-$220_2$ in the form of field-effect transistors. The code sections SD0, SD1 and SD2 are present at a respective one of the-gate terminals G of the field-effect transistors $220_0$-$220_2$. The drain terminals D of the respective field-effect transistors are connected to ground (GND) and the source terminals S of the respective field-effect transistors are connected with the outputs $210_1$-$210_3$ of the transmitter 200. Depending on the signal value of the code section SD0, SD1 or SD2, the respective associated output $210_1$-$210_3$ is left at the potential prevailing there or is switched to ground.

The receiver 202 comprises three inputs $212_1$-$212_3$, the corresponding inputs of the receiver 202 and the corresponding outputs of the transmitter 200 being connected with one another in the manner shown in FIG. 11 by way of the transmission lines $204_1$-$204_3$ of the transmission medium 204. The inputs $212_1$-$212_3$ are each connected with a respective one of the inputs Qf the amplifiers $222_0$-$222_2$, and with the drain terminals D of the field-effect transistors $224_0$-$224_2$ connected up as MOS diodes. The outputs of the amplifiers $222_0$-$222_2$ supply the received signal values of the code sections SD0'-SD2'. Furthermore, a supply line VDD is provided in the receiver 202, which on the one hand supplies the amplifiers $222_0$-$222_2$ with the required supply voltage and is also connected to a current source $I_{drv}$, which in turn is connected to the gate and source terminals of the field-effect transistors $224_0$-$224_2$.

FIG. 11 shows one possible driver and receiver circuit for a three-wire transmission system. The lines are actively terminated by the field-effect transistors $224_0$-$224_2$ and furthermore the current source $I_{drv}$ is provided on the receiver side 202. The transmitter 200 sends the code by drawing one of the lines 204₁-204₃ to ground (see also the state diagram in FIG. 9, according to which each code only has one zero). The code transitions displace the current from line to line.

Figure 12:
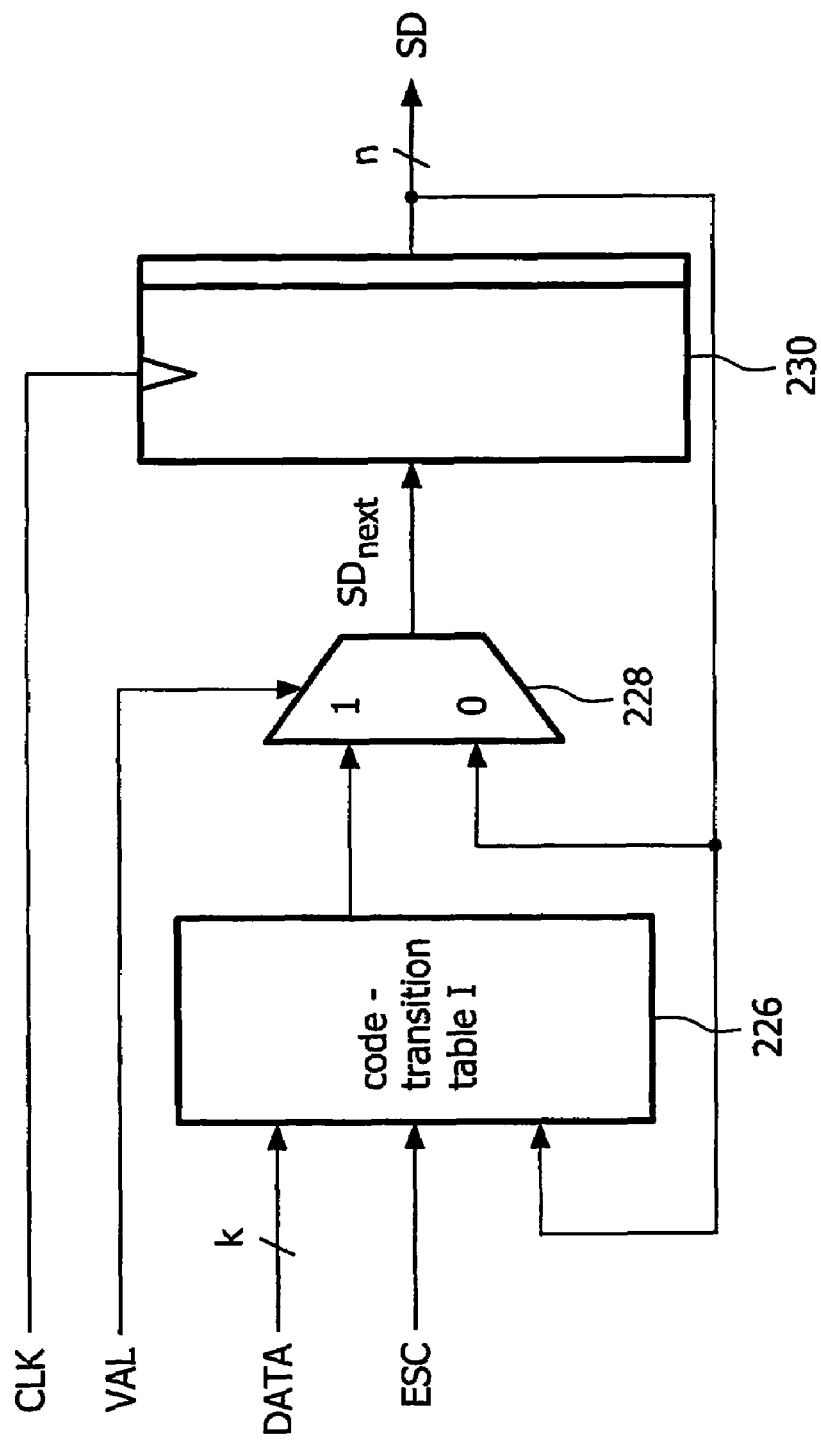
FIG. 12 is a block diagram of a data encoder.

FIG. 12 shows an example of a block diagram of a data encoder, as is used according to the invention. The data encoder (FIG. 12) comprises a code-transition table I 226, a multiplexer 228 and an output register 230. As well as the data signal DATA (k bits, k=1, 2, 3 . . . ), which can comprise one bit or a plurality of bits, the table 226 receives an escape input signal ESC. A validation signal VAL is applied as selection signal to the multiplexer 228, and the clock signal CLK activates the output register 230. As can be seen, the code table 226 additionally receives the code signal SD (n bits, k=3, 4, 5 . . . ) appearing at the output of the encoder, and, based on the data signal present and the escape signal present, generates at the output a new code $SD_{next}$, which, in the case of a valid action through a corresponding value of the signal VAL, is selected by means of the multiplexer 228 and output by way of the register 230. The next code value is thus a function of the validation signal VAL, the data signal DATA, the escape signal ESC and the preceding code SD.

If no valid data is present, the signal VAL goes to a low logic level of "0" and prevents a code progression or code change, by selecting as the next code value $SD_{next}$ the code value SD appearing at the output, by corresponding activation of the multiplexer 228. The arrangement shown in FIG. 12 is a general transition-encoding machine. As mentioned, the next code is a function of the preceding code, the data input and the ESC input and the validation signal VAL. The validation signal stops code progressions whenever no new data, is supplied. If the data is invalid, no clock pulse is encountered at the receiver side. The ESC signal basically also carries input data, but allows the use of the redundant code transition that becomes available for four or more code bits.

Figure 13:
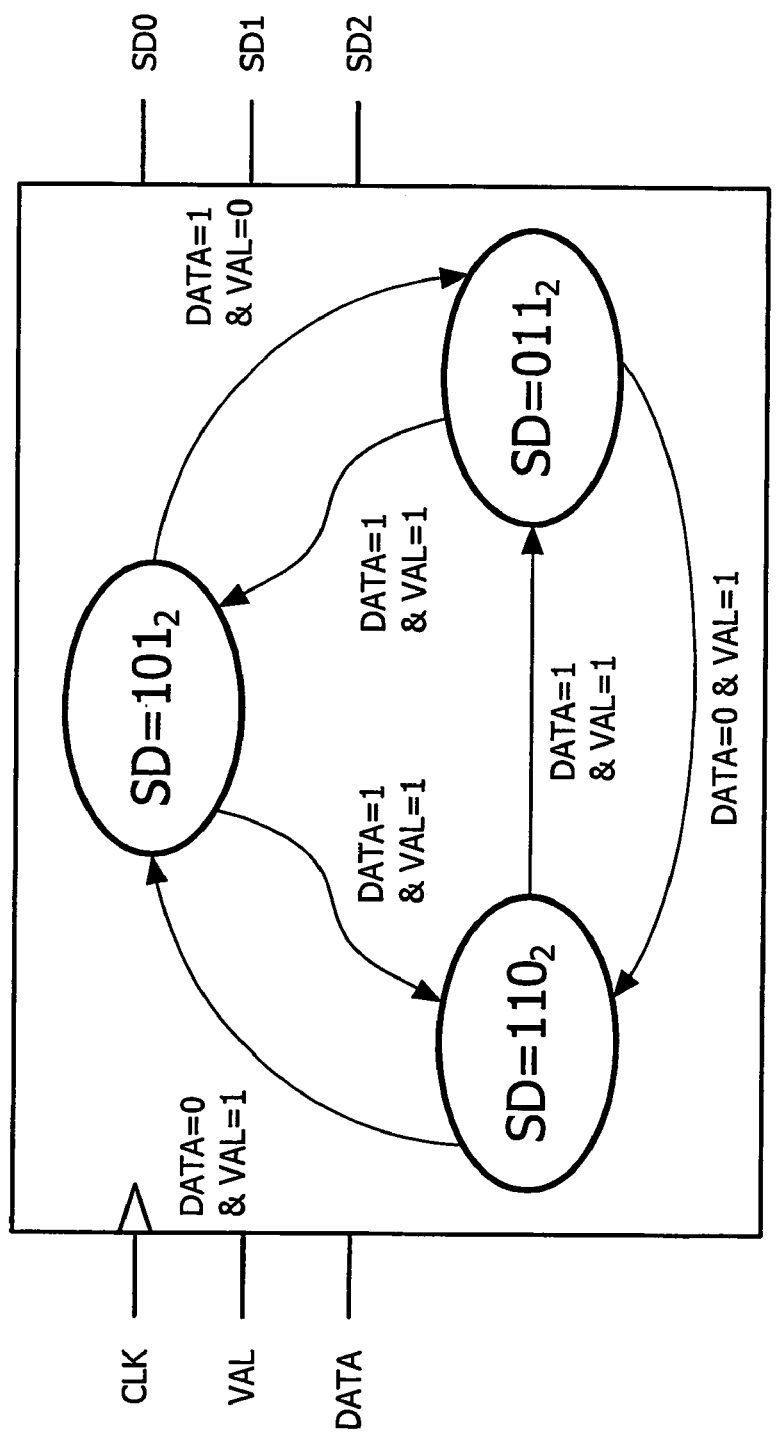
FIG. 13 shows a state machine for a three-wire data encoder.

In the case of a three-wire system, the transition encoding-can be carried out by means of the state diagram shown in FIG. 13 for a three-wire data encoder. Here, a so-called more-state machine is used, and a 2-hot encoding is used. The transitions correspond to those that have already been described with reference to FIG. 9, although here additionally the validation information signal VAL is included, which for corresponding transitions always has the value of "1".

Figure 14:
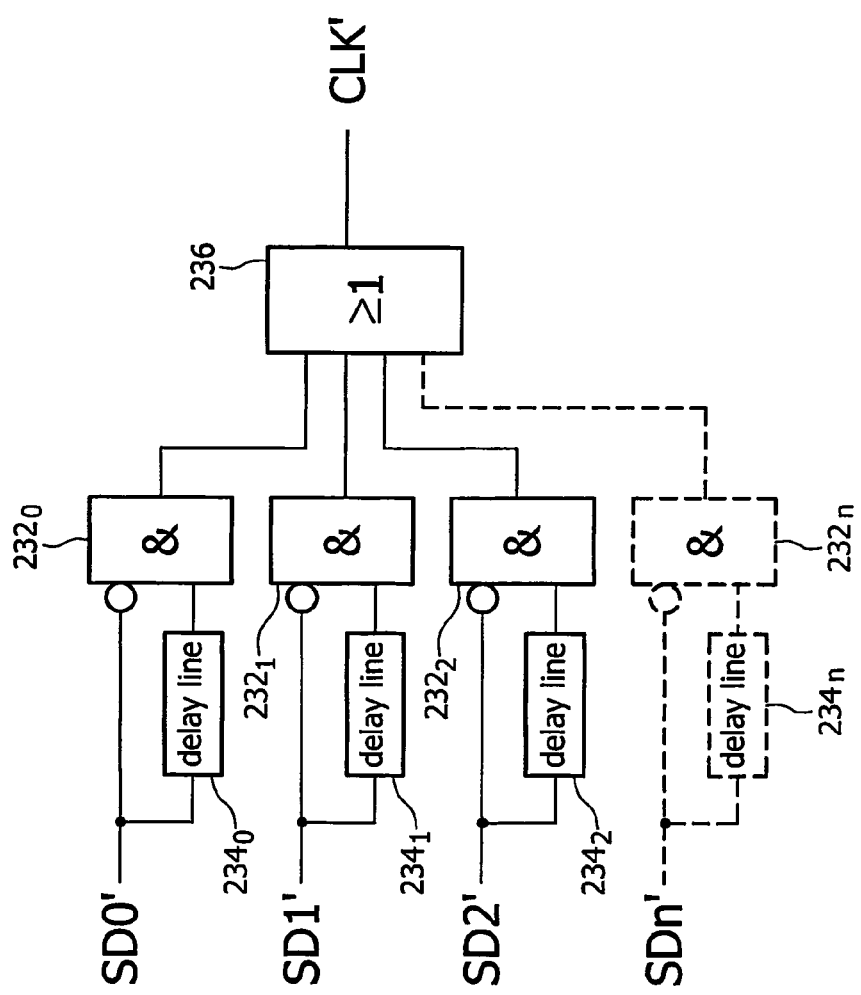
FIG. 14 is a block diagram of a timing recovery circuit.

FIG. 14 shows an example of a timing recovery circuit in order on the receiver side to recover the clock signal from the received code section values SD0'-SDn'. The circuit comprises a plurality of AND gates 232₀-232ₙ, the AND gates receiving at a first input the respective inverted signal of the corresponding code section and receiving by way of a second input the signal from the code section input delayed by a predetermined time interval by means of a corresponding delay line 234₀-234ₙ. The outputs of the AND gates 232₀-232ₙ are logically combined by means of an OR gate, and the output of the OR gate 236 corresponds to the clock signal CLK'. As mentioned, the timing recovery is carried out by the circuit shown in FIG. 14, which exploits the fact that always at least one transition from a "0" to a "1" takes place between DC-averaged codes, irrespective of the number of wires or lines used. Using a delay element 234₀-234ₙ (e.g. an inverter chain), a short pulse of the transition is generated. Different "0"-to-"1" transitions in the code occur at the same time and are combined by means of the inclusive OR operation to a common pulse. The clock cycle of the recovered timing depends on the transmission clock cycle and the length of the delay element. In many systems, different transmission clock cycles are used to transmit a complete word (e.g. 16 bits). Normally, only this word time is required for the further processing. Since a shared version of the transmission clock pulse is involved here, its clock cycle can be controlled in a simple manner.

Figure 15:
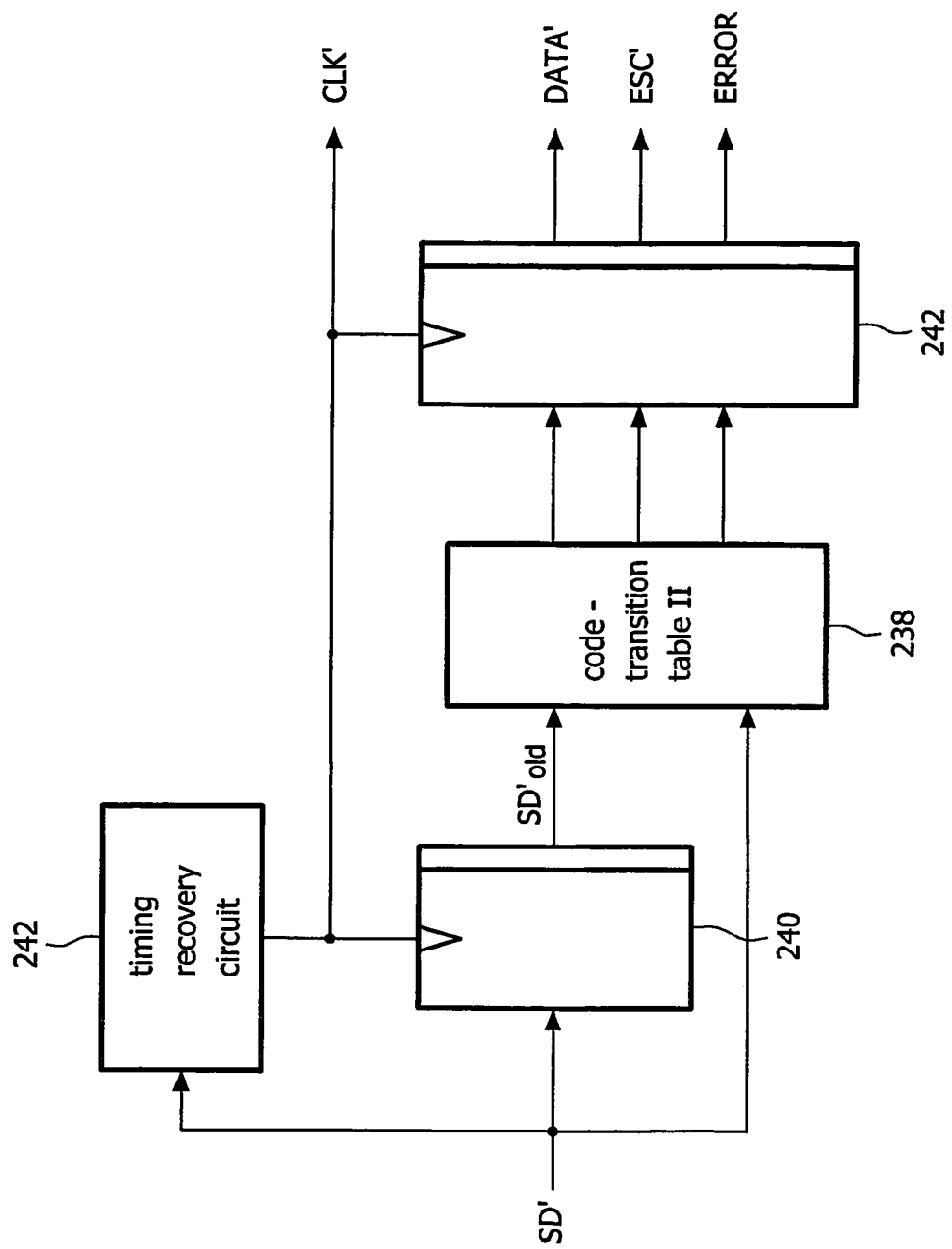
FIG. 15 shows an example of a data decoder.

FIG. 15 shows an example of a data decoder on the receiver side, in order from the received code word SD' to generate the clock pulse CLK', the transmitted DATA', an ESC information signal ESC' and optionally an error signal. The arrangement comprises a code transition table II 238, which receives the preceding code $SD'_{old}$ by way of an input register 240 and the current code directly from the input SD'. In addition, from the received code SD' the clock signal CLK' is recovered by means of the timing recovery circuit 242, in the manner described with reference to FIG. 14, and is used to release the input register 240 and to release an output register 242. Based on the information supplied, the code transition table II 238 generates the signals DATA', ESC' and ERROR, which are output under control of the recovered clock signal CLK' by the output buffer 242. By means of the arrangement shown in FIG. 15, the original data is decoded by comparison of the arriving code with a preceding code, the code transition table II 238 being provided to look up the data for every possible combination. Transitions from and to unused symbols that are not a component of the code can be reported as errors.

It should be pointed out that the code transition table differs from that used for the encoder shown in FIG. 12. Processing of the information on the receiver side can include different pipeline stages. Since no clock pulse is recovered for invalid data, information that was transmitted previously can get stuck in the receiver pipeline. In order to shift or get this information propagated through the pipeline, dummy data is included by the transmitter, e.g. using the ESC signal.

Figure 16:
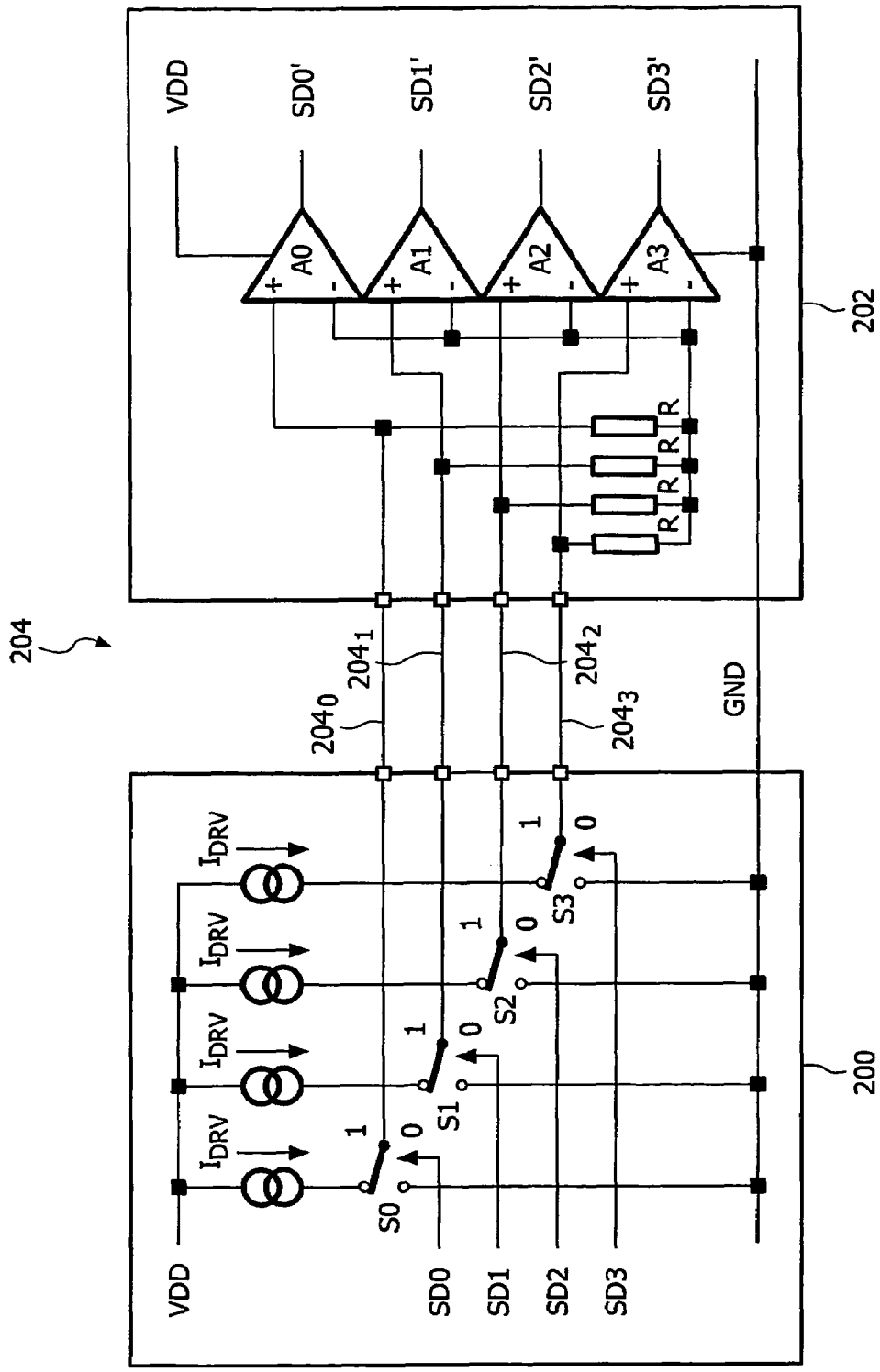
FIG. 16 shows an example of a circuit for a four-wire current loop.

FIG. 16 shows a circuit example according to a further exemplary embodiment of the present invention for a four-wire current loop. In this exemplary embodiment, the transmitter 200 comprises four switches S₀-S₃, which are controlled in dependence on the signal values of the code sections SD0-SD3. The switches S₀-S₃ are provided to drive the transmission lines 204₀-204₃ connected to them of the transmission medium 204 to a ground potential GND, or to a current level as supplied by the current sources $I_{drv}$ in the transmitter 200.

The receiver 202 comprises a plurality of amplifiers A₀-A₃, which output the signal values of the individual code sections SD0'-SD3'. The lines 204₀-204₃ are connected with corresponding non-inverting inputs of the amplifiers A₀-A₃ and additionally by way of a respective terminating resistor R to the inverting inputs of the amplifiers A₀-A₃. With the four transmission lines or wires 204₀-204₃ shown in FIG. 16, the principle of current loop signaling can be extended, using the MWS encoding scheme. The circuit shown in FIG. 16 shows the principles of a four-wire system with transmitter 200 and receiver 202. A constant current flows on two lines from the transmitter 200 to the receiver 202, and the other two lines are connected to ground and represent the return path. The passive terminating resistor network R generates a common reference level at its star point. By detecting a voltage drop across the individual resistors, the binary signal levels can be determined. The voltage levels at the receiver input are below the reference level for the lines that are drawn to ground. The voltage level is above the level of the star point for the lines that are supplied with a constant current. The cumulative current of all four lines is constantly zero, regardless of which code is being transmitted.

Figure 17:
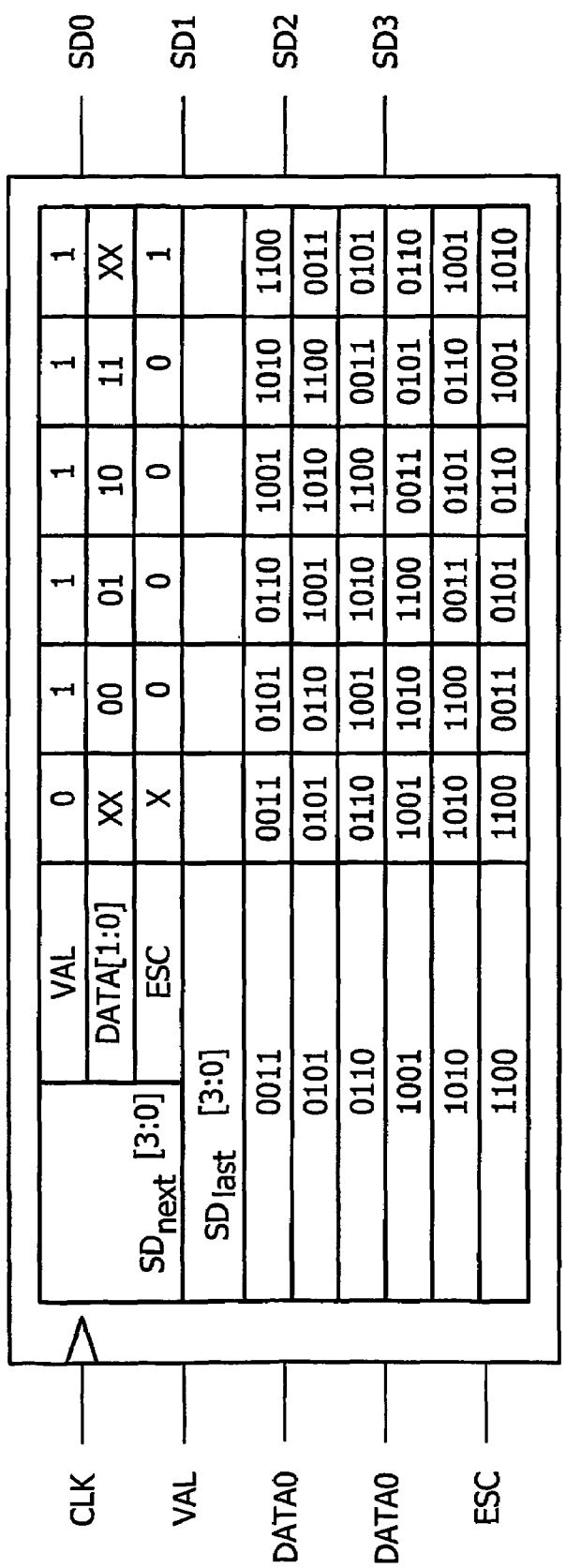
FIG. 17 shows an example of a four-wire data encoder.

FIG. 17 shows an example of a four-wire data-encoder, according to which the next code is selected on the basis of the data appearing, the preceding code, a validation signal and an ESC signal. The encoding machine shown in FIG. 17 is used for the four-wire encoding. It contains a code-transition table for two bit data input plus an ESC signal. In a real circuit the table is a very compact combinational logic circuit. The timing recovery and data decoding on the receiver side is carried out using the circuits described in FIGS. 14 and 15. In respect of the code sequence provided, the code transition table in the data-decoder must correspond to that in the encoder.

The advantages of the methods and devices according to the invention over conventional approaches that were described above with reference to FIGS. 1-4 are apparent from the following table.

|  | Difference signaling | Data/strobe signaling | Multi-wire 3 | Multi-wire 4 |
|---|---|---|---|---|
| Total number of signal wires | 4 | 4 | 3 | 4 |
| Number of shields | 2 | 2 | 1 | 1 |
| Bits per cycle | 1 | 1 | 1 | 2 |
| Maximum transitions per cycle | 6 | 2 | 2 | 4 |
| Average transitions per cycle | 5 | 2 | 2 | 2.4 |
| Average transitions per bit | 5 | 2 | 2 | 1.2 |
| Maximum signal frequency | 1/t_cycle | 0.5 * 1/ t_cycle | 0.5 * 1/ t_cycle | 0.5 * 1/ t_cycle |
| ESC code | NO | NO | NO | YES |
| Timing recovery-phase-locked loop | NO | NO | NO | NO |

Although preferred exemplary embodiments of the present invention have been explained in detail above on the basis of binary code, it is obvious to the expert that the present invention is not restricted to this specific type of code. On the contrary, any code can be chosen, provided that it is ensured that the signal values existing by virtue of the individual code sections on the corresponding adjacent lines are constant in sum.

The invention claimed is:

1. A method for transmitting data units by way of a transmission medium that comprises at least three adjacent transmission lines, the method comprising:
   supplying a plurality of codes from a memory in which the plurality of codes is stored, each code comprising a number of code sections that corresponds to the number of transmission lines of the transmission medium, each code section of a code on an associated transmission line having a predetermined signal value, and the sum of the signal values being substantially constant for each transmitted code;
   for each data unit to be transmitted, selection of a code from the plurality of codes; and
   supplying the selected code for a transmission by way of the transmission medium.

2. The method as claimed in claim 1, in which the data units and the codes to be transmitted are supplied in accordance with a predetermined clock pulse, wherein at each new clock pulse a new code is selected, based on the preceding code and the new data unit.

3. The method as claimed in claim 1, in which the code is a binary code, each of the codes comprising the same number of code sections with a high logic level and code sections with a low logic level.

4. The method as claimed in claim 3, in which a data unit comprises one bit or a plurality of bits.

5. The method as claimed in claim 1, in which the sum of the signal values is substantially zero.

6. A method for receiving data units by way of a transmission medium that comprises at least three adjacent transmission lines the data units having been sent in accordance with a method as claimed in claim 1, the method comprising the following steps:
   receiving the transmitted codes transmitted on the transmission medium;
   assigning the received codes to the appropriate data units; and
   outputting the data units.

7. The method as claimed in claim 6, further comprising: recovery of a clock signal based on transitions of the codes transmitted by way of the transmission medium.

8. A device for transmitting data units by way of a transmission medium that comprises at least three adjacent transmission lines, the device comprising:
   an input for receiving the data units;
   a memory, in which a plurality of codes is stored, each code comprising a number of code sections that corresponds to the number of transmission lines of the transmission medium, each code section of a code on an associated transmission line having a predetermined signal value, and the sum of the signal values being substantially constant for each transmitted code;
   a selection device, which is actively connected with the input and the memory in order to select and supply from the memory a code for a data unit received at the input; and
   an output that is actively connected with the selection device in order to supply the code supplied by the same for a transmission by way of the transmission medium.

9. The device as claimed in claim 8, with a clock input for receiving a clock pulse, a data unit appearing at the input at each new clock pulse, and the selection device selecting and supplying, on the basis of the preceding code and a new data unit, a new code for the new clock pulse.

10. A device for receiving data units from a transmission medium that comprises at least three adjacent transmission lines the data units being sent by a device as claimed in claim 8, having
    an input for receiving the codes from the transmission medium;
    an arrangement for assigning the received codes to the corresponding data units; and
    an output for outputting the data units.

11. The device as claimed in claim 10, having a timing recovery circuit for recovering a clock signal based on transitions of the codes transmitted by way of the transmission medium.

12. A device for transmitting data units, the device comprising:
    a device for transmitting data units as claimed in claim 10;
    a transmission medium that is actively connected with the device for transmitting and has at least three adjacent transmission lines; and
    a device actively connected with the transmission medium for receiving data units.

* * * * *